United States Patent
Guo et al.

(10) Patent No.: US 9,941,889 B1
(45) Date of Patent: Apr. 10, 2018

(54) CIRCUIT AND METHOD FOR COMPENSATING NOISE

(71) Applicant: Beken Corporation, Shanghai (CN)

(72) Inventors: Dawei Guo, Shanghai (CN); Caogang Yu, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days.

(21) Appl. No.: 15/590,730

(22) Filed: May 9, 2017

(30) Foreign Application Priority Data

Apr. 18, 2017 (CN) .......................... 2017 1 0253797

(51) Int. Cl.
| | |
|---|---|
| *H03K 5/133* | (2014.01) |
| *H03L 7/08* | (2006.01) |
| *H03C 3/09* | (2006.01) |
| *H03L 7/197* | (2006.01) |
| *H03D 3/24* | (2006.01) |
| *H03K 21/00* | (2006.01) |
| *G11B 7/09* | (2006.01) |
| *G06F 7/499* | (2006.01) |

(52) U.S. Cl.
CPC ........ *H03L 7/0805* (2013.01); *G06F 7/49942* (2013.01); *G11B 7/0943* (2013.01); *H03C 3/0908* (2013.01); *H03D 3/241* (2013.01); *H03D 3/248* (2013.01); *H03K 5/133* (2013.01); *H03K 21/00* (2013.01); *H03L 7/1976* (2013.01)

(58) Field of Classification Search
CPC . H03L 7/0805; H03L 7/1976; G06F 7/49942; G11B 7/0943; H03K 5/133; H03K 21/00; H03D 3/241; H03D 3/248; H03C 3/0908

USPC ................ 375/354, 371, 373, 374, 375, 376
See application file for complete search history.

(56) References Cited

U.S. PATENT DOCUMENTS

| | | | | |
|---|---|---|---|---|
| 7,634,041 B2 * | 12/2009 | Yu | .......................... | H03L 7/1976 375/376 |
| 8,149,022 B2 * | 4/2012 | Wang | ........................ | H03L 7/16 327/105 |

(Continued)

OTHER PUBLICATIONS

Eikenbroek Johannes Wilhelmus Theodorus (WO/2004/088846 A1) published on Oct. 14, 2004.*

(Continued)

*Primary Examiner* — Siu Lee
(74) *Attorney, Agent, or Firm* — Perkins Coie LLP

(57) ABSTRACT

A circuit for compensating quantized noise in fractional-N frequency synthesizer, comprising a PLL circuit that locks a phase compensated signal to a phase of a reference phase, wherein the phase lock loop circuit comprises a frequency divider and a phase frequency detector; a sigma-delta modulation and phase difference calculator coupled to the frequency divider generating an accumulated phase error by accumulating all previous differences between an input of the frequency divider and an output of the frequency divider within a period; a digital controlled delay line coupled to both the frequency divider and the SDM and Phase Difference calculator and generates the phase compensated signal by multiplying the accumulated phase error with a delay control word; and the phase frequency detector further generates a phase error by comparing the phase compensated signal with the reference clock.

13 Claims, 10 Drawing Sheets

(56) References Cited

U.S. PATENT DOCUMENTS

2014/0091844 A1* 4/2014 Jakobsson ............ H03L 7/1974
327/158
2016/0294398 A1* 10/2016 Verlinden ............... H03L 7/087

OTHER PUBLICATIONS

Scott Meninger, Michael Perrott, Sigma-Delta Fractional-N Frequency Synthesis, Massachusetts Institute of Technology, Jun. 7, 2004, http://www.ece.ucsb.edu/Faculty/rodwell/Classes/ece218b/notes/MTT_2004_meninger_IntNFracN.pdf.

* cited by examiner

CIRCUIT AND METHOD FOR COMPENSATING NOISE

CLAIM OF PRIORITY

This application claims priority to Chinese Application number 201710253797.X entitled "A CIRCUIT FOR COMPENSATING QUANTIZED NOISE IN FRACTIONAL-N FREQUENCY SYNTHESIZER," filed on Apr. 18, 2017 by Beken Corporation, which is incorporated herein by reference.

TECHNICAL FIELD

The present application relates to a fractional-N frequency synthesizer and more particularly, but not exclusively, to compensating quantization noise.

BACKGROUND

In a conventional fractional-N frequency synthesizer, the divider ratio N implemented by a feedback loop frequency divider varies in each reference cycle. The variation in the divider ratio N is reflected as quantized phase noise at the output of the frequency synthesizer. If not properly addressed, the quantized noise will severely affect system performance. Thus compensating quantization noise becomes indispensable in many applications.

Therefore, it is desirable to design a method and device for effectively compensating quantized noise.

SUMMARY

According to an embodiment of the invention, a circuit for compensating quantized noise in fractional-N frequency synthesizer comprises a Phase Lock Loop (PLL) circuit, configured to lock a phase compensated signal to a reference phase, wherein the phase lock loop circuit comprises a frequency divider, a phase frequency detector; a SDM (sigma-delta modulation) and phase difference calculator coupled to the frequency divider and configured to generate an accumulated phase error by accumulating all previous differences between the input of the frequency divider and the output of the frequency divider within a period; a digital controlled delay line coupled to both the frequency divider and the SDM and Phase Difference calculator and configured to generate the phase compensated signal by multiplying the accumulated phase error with a delay control word, wherein the delay control word is derived from a module that takes a reference clock and a calibration clock as inputs; and the phase frequency detector is further configured to generate a phase error by comparing the phase compensated signal with the reference clock.

According to another embodiment of the invention, a method of compensating quantized noise in fractional-N frequency synthesizer, comprises locking, by a phase lock loop, a noise compensated signal to a phase of a reference phase, wherein the phase lock loop circuit comprises a frequency divider and a phase frequency detector; generating, by a SDM (sigma-delta modulation) and phase difference calculator, an accumulated phase error by accumulating all previous differences between the input of the frequency divider and the output of the frequency divider within a period; generating, by a digital controlled delay line, the phase compensated signal by multiplying the accumulated phase error with a delay control word, wherein the delay control word is derived from a module that takes a reference clock and a calibration clock as an input; calibrating, by a delay calibration circuit, the delay control word; and generating, by the phase frequency detector, a phase error by comparing the compensated phase with the reference clock.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
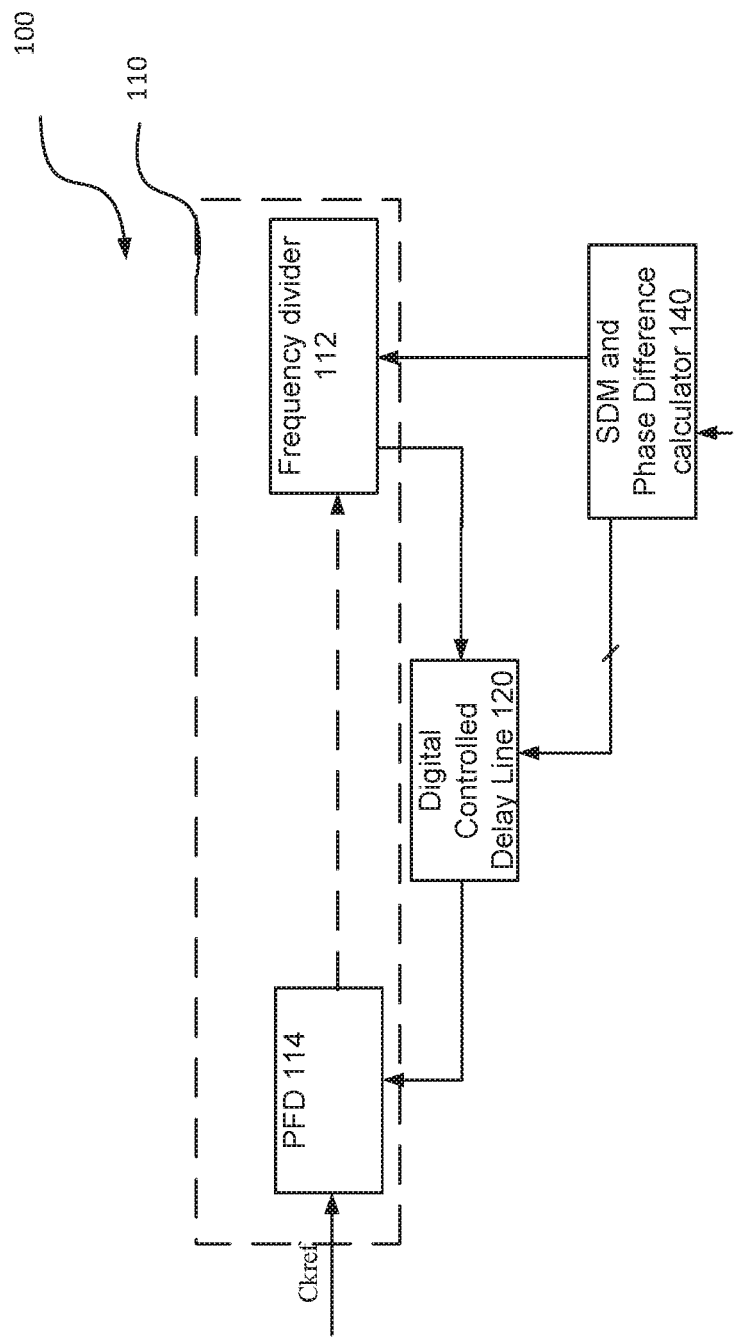
FIG. 1 is a block diagram for a circuit 100 according to an embodiment of the invention.

FIG. 1 is a block diagram for a circuit according to an embodiment of the invention. The circuit 100 for compensating quantized noise in fractional-N frequency synthesizer, comprising a Phase Lock Loop (PLL) circuit 110, a digital controlled delay line 120, and a Sigma-Delta Modulation (SDM) and phase difference calculator 140.

Figure 4:
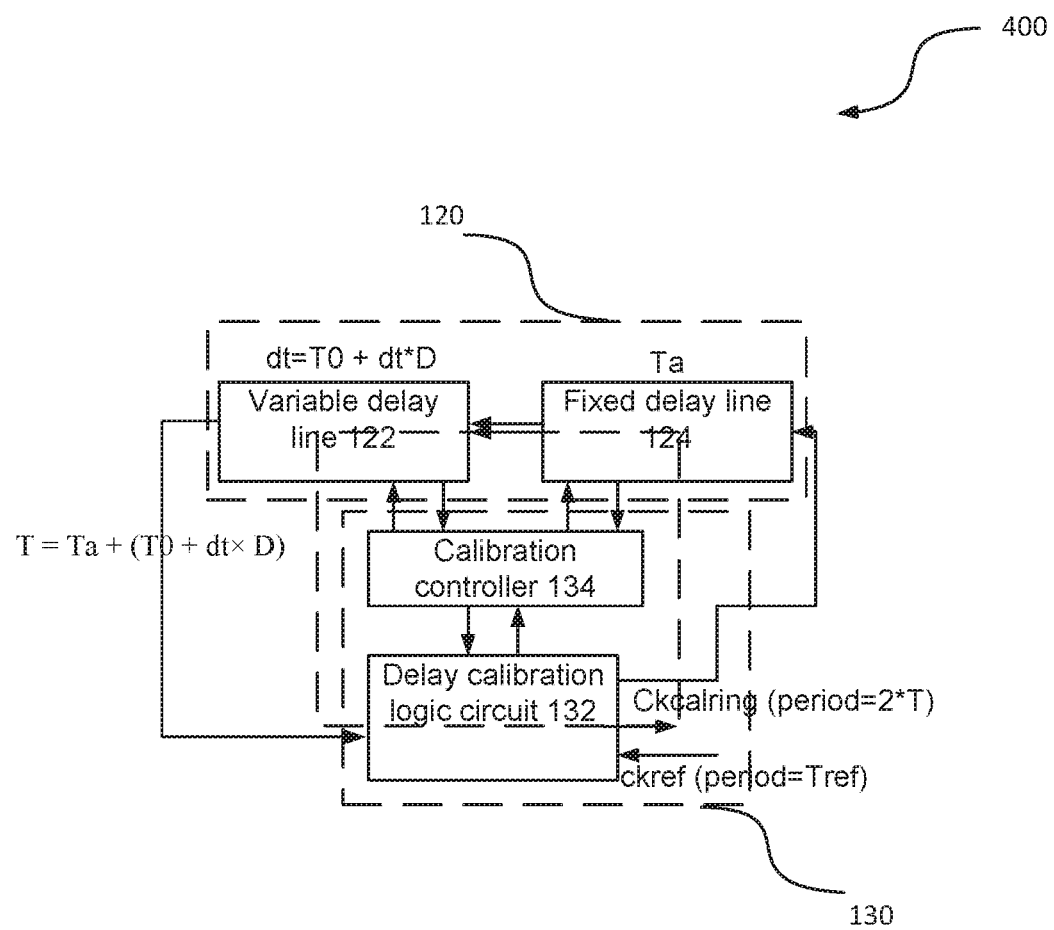
FIG. 4 is a diagram illustrating a data path in calibration mode according to an embodiment of the invention.

The Phase Lock Loop (PLL) circuit 110 locks a phase compensated signal to a phase of a noise free (in terms of noise concerned here, which is quantization noise) reference phase. The phase lock loop circuit 110 comprises a frequency divider 112 and a phase frequency detector 114. The SDM (sigma-delta modulation) and phase difference calculator 140 is coupled to the frequency divider 112. The SDM and phase difference calculator 140 generates an accumulated phase error by accumulating (at every reference cycle) all previous differences between an input of the frequency divider and an output of the frequency divider 112 within a period. The output of the SDM and phase difference calculator 140 is fed to the frequency divider 112 as a control signal, so as to decide the devisor N of the frequency divider 112. For example, if the SDM and phase difference calculator 140 outputs a value of 100, the frequency divider 112 will output an output signal after the frequency divider 112 counts 100 cycles of input signals. After the calibration, the circuit modules that participate the calibration has stopped activity (without any dynamic change), while the calibrated values have been locked, and do not change. The calibrated values are used to control a variable delay. Note the SDM 142, Instantaneous phase difference calculator 144, variable delay line 122, fixed delay line 124, delay calibration controller 134, and calibration logic circuit 132 participate in the calibration process, most of which are shown in FIG. 4. By contrast, the conventional calibration process requires all modules of the frequency synthesizer in normal working conditions, which needs the aid of complex and high-speed digital circuits, therefore resulting in high power consumption and requires advanced process technology. The embodiments of the invention do not need the aid of complex and high-speed digital circuits, therefore does not have unnecessarily limitation on the power and process requirements. The digital controlled delay line 120 is coupled to both the frequency divider 112 and the SDM and Phase Difference calculator 140. The digital controlled delay line 120 generates the phase compensated signal by multiplying the accumulated phase error with a delay control word. The delay control word is derived from the delay calibration module that takes a reference clock and a calibration clock as inputs. The phase frequency detector 114 is further configured to generate a phase error by comparing the phase compensated signal with the reference clock Ckref. Note the Reference signal Ckref is an external signal, which can be provided by an external frequency oscillator.

Figure 1A:
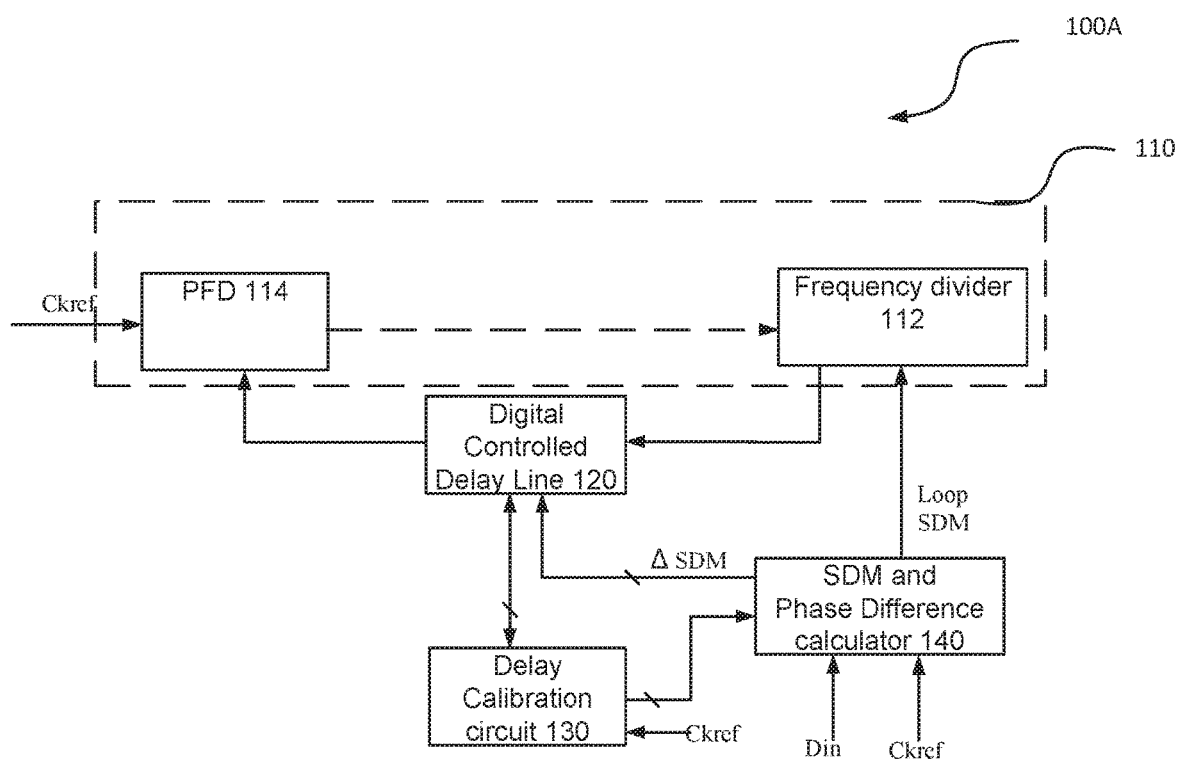
FIG. 1A is a block diagram for a circuit 100A according to an embodiment of the invention.

FIG. 1A is a block diagram for a circuit 100A according to an embodiment of the invention. As the PLL circuit 110, the digital controlled delay line 120, the SDM (sigma-delta modulation) and phase difference calculator 140 are already shown and discussed with respect to FIG. 1, their detailed descriptions are omitted with respect to FIG. 1A. The circuit 100A further comprises a delay calibration circuit 130. The delay calibration circuit 130 couples to both the digital controlled delay line 130 and the SDM and Phase Difference calculator 140. The delay calibration circuit 130 is configured to calibrate the delay control word. As shown in FIG. 1A, the delay calibration circuit 130 calibrates the delay control word based on the reference clock Ckref. The delay calibration circuit 130 may be a digital circuit for calibrating the controlled time delay. The calibration results are used to control the digital gain of the SDM and phase difference calculator 140. In an embodiment, the reference clock signal Ckref that enters the PFD 114, the delay calibration circuit 130 and the SDM and phase difference calculator 140 is the same signal. The clock signal Ckref that enters the PFD 114, the calibration circuit 130 and the SDM and phase difference calculator 140 comes from the same source, which has same frequency and phase. Cref may be provided by an external reference signal, which may be fixed in normal circumstances (that is not modulated).

Also note that during a normal compensation procedure, the delay calibration circuit 130 may not operate so as to avoid noise crosstalk.

SDM and phase difference calculator 140 is implemented in the digital domain. The SDM and phase difference calculator 140 calculates phase error associated with the current phase comparison according to the change of the instantaneous frequency divider ratio N. After the error is amplified, the amplified error is quantized again, which outputs a control signal with relatively smaller bit width to the digital controlled delay line 120, for compensating quantized noise. Normally the instantaneous error generated along the SDM path (illustrated by an arrow from the SDM and phase difference calculator 140 to the frequency divider 112) is larger than 20 bits, which is impractical to control the digital controlled delay line 120 directly. Through second quantization in the instantaneous phase difference calculator 144, the bit width of the signal, for example Δ SDM (illustrated by an arrow from the SDM and phase difference calculator 140 to the digital controlled delay line 120), can be reduced to only eight or fewer. This control word with reduced width can be used to achieve effective control of the delay line 120.

Figure 2:
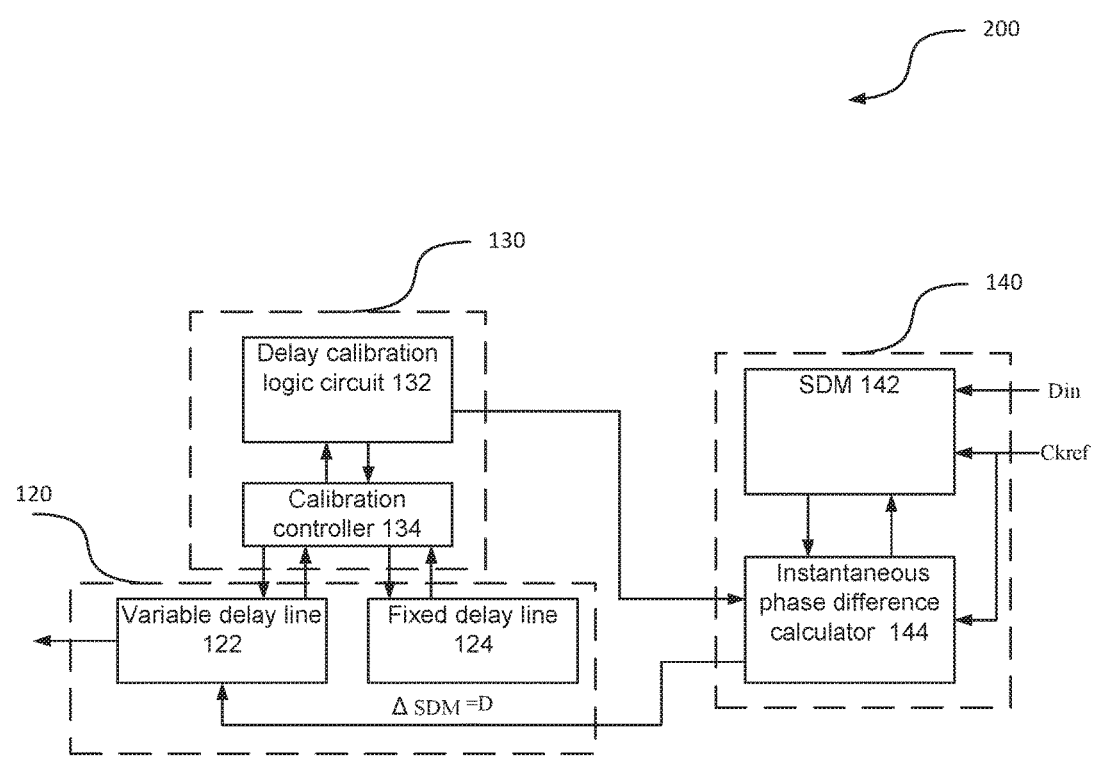
FIG. 2 is a block diagram 200 showing detailed implementation of delay calibration circuit 130, digital controlled delay line 120, and the SDM (sigma-delta modulation) and phase difference calculator 140 shown in FIG. 1A according to an embodiment of the invention.

FIG. 2 is a block diagram 200 showing detailed implementation of delay calibration circuit 130, digital controlled delay line 120, and the SDM (sigma-delta modulation) and phase difference calculator 140 shown in FIG. 1A according to an embodiment of the invention.

As shown in FIG. 2, the delay calibration circuit 130 further comprises a delay calibration logic circuit 132 and a calibration controller 134. The calibration controller 134 determines whether the device works in calibration mode or in operation mode and controls signal timing required in the calibration. To be more specific, the calibration controller 134 selects different signal paths for the calibration mode and the operation mode. The delay calibration logic circuit 132 is coupled to the calibration controller 134 and is configured to generate the delay control word Dx0 if the calibration controller sets the device into calibration mode. The calibration controller defines control signal sequence and the logic circuit utilizes these signals and generates the delay control word as a result.

Further, as shown in FIG. 2, the SDM and phase difference calculator 140 further comprises a sigma-delta modulator (SDM) 142, and an instantaneous phase difference calculator 144. The instantaneous phase difference calculator 144 is configured to generate an instantaneous phase difference dNi of the current reference cycle by subtracting the current input of the frequency divider from the current output of the frequency divider. The instantaneous phase difference dNi is a signed number, which cannot be used directly in actual phase compensation. In the actual compensation, a fixed offset is added to convert the signed dNi to an unsigned value that is used to control the delay line.

The sigma-delta modulator 142 is coupled to the instantaneous phase difference calculator 144 and is configured to generate the accumulated phase error by accumulating all previous dNi, which are the instantaneous phase differences between the input of the frequency divider 112 and the output of the frequency divider 112 within the period. The details of accumulation of dNi will be explained further below.

The input of SDM 142 comprises Din and Ckref. Din is the digital representation of a decimal or fractional value. For an example, Din has 32 bits, which can be represented as Din<31:0>. Din can be further represented as Ni·Nf, wherein Ni represents the integer part of Din, and Nf represents the fractional part of Din. For an example, Ni is represented by the highest 8 bits and Nf by the remaining 24 bits of Din. The SDM 142 is further connected to the Frequency divider 110.

The output of SDM 142 to the Frequency divider 110 is an integer value, in this case is 8 bits of Ni. Generally, the output of SDM 142 is a random sequence with a given average value. Deviation from this average at any instance is rather random. Further, Ni and N[i+1] only indicates any two consecutive outputs. For an example, SDM 142 outputs an integer 100 to the frequency divider 110, which means that the frequency divider 110 will count 100 cycles of the input signal, and then generate a signal pulse with a given pulse width.

According to an embodiment, the calibration controller 134 can select signal paths between a normal operating mode and a calibration mode.

The delay calibration logic circuit 132 is a digital module for calibrating controlled time delay, and the calibration results are used as a scaling factor for digital control word used in the noise calculation module.

The instantaneous phase difference calculator 144 operates in the digital domain, and calculates the phase error for the current comparison instance, according to an instantaneous change in the divider ratio. The error is scaled and then quantized again to reduce bit width. The output, with smaller bit width, is used as a control signal to the digitally controlled delay line to compensate quantization noise.

According to embodiments above, the variable delay module 122 adds low noise in the signal path, and dynamically adjusts the time delay, so as to reduce the phase difference between the reference clock and the output signal of the loop divider, therefore suppressing the quantization noise.

Fixed delay line 124 is only used in the calibration signal pathway, which increases the total delay time and is irrelevant to the variable delay, is used to reduce the operating frequency in the calibration process. The fixed delay line is by-passed in normal operation mode, so that the fixed delay line 124 will not introduce any noise in the normal operation mode.

Figure 3:
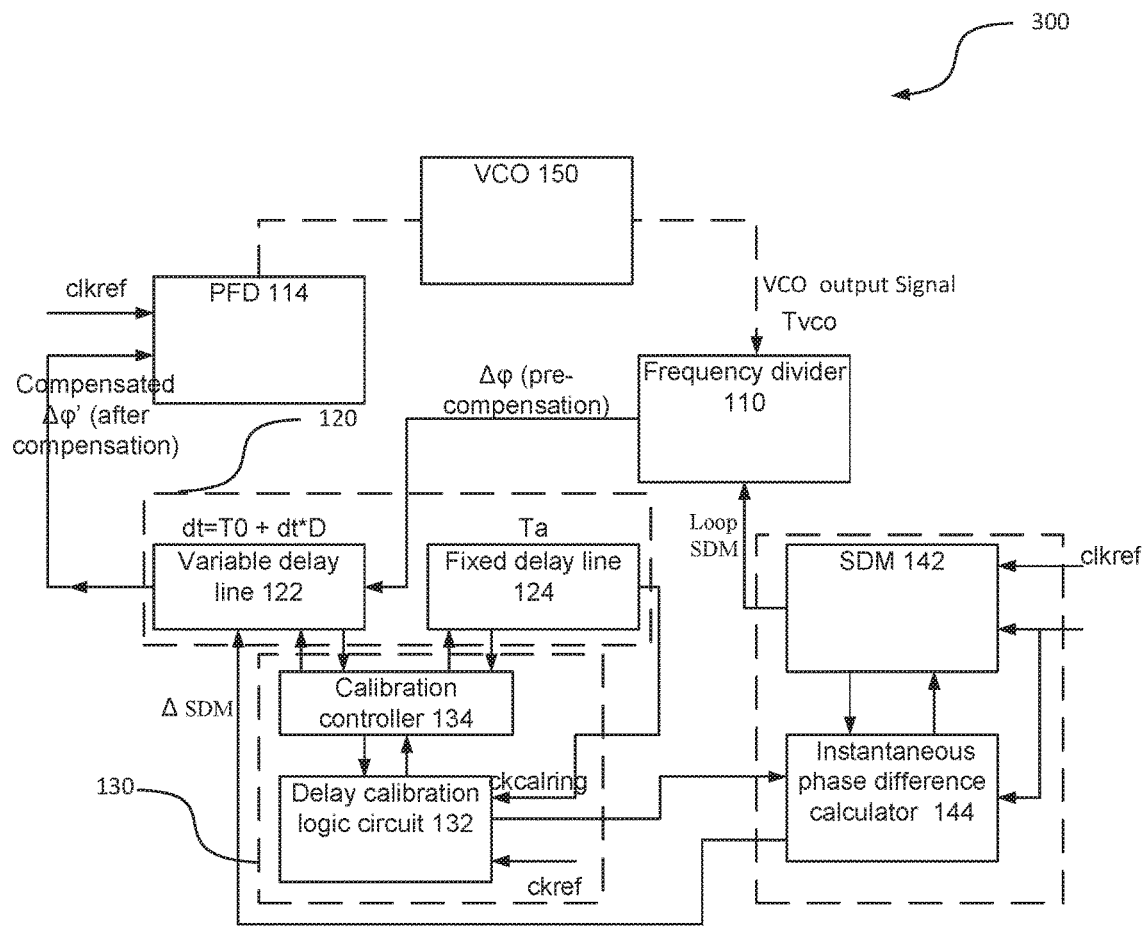
FIG. 3 is a block diagram for a circuit 300 according to an embodiment of the invention.

FIG. 3 is a block diagram for a circuit 300 according to an embodiment of the invention.

During normal operation, after the variable delay line 132 within the digital controlled delay line 130 delays an output of the frequency divider 110, the output of the variable delay line 132 is compared with the reference clock Ckref by the phase detector (PFD) 114. The phase detector 114 generates a phase error signal to bring the loop to a locked state.

The control signal Δ SDM fed into the digital controlled delay line 120 is generated by the instantaneous phase difference calculator 144 within the SDM and Phase Difference calculator 140, which contains delay gain or scaling factor estimated by the delay calibration logic circuit 132.

The SDM and phase difference calculator 140 receives both the reference clock signal Ckref and the frequency control signal, Din, and outputs an integer frequency division ratio to the frequency divider 112, and outputs a delay control word (Δ SDM) into the variable delay line 122. Frequency control signal is the SDM input. Since it is used to generate a signal with frequency of (SDM input)*Ckref, it is called frequency control signal.

FIG. 4 is a diagram illustrating a data path in calibration mode according to an embodiment of the invention. The delay calibration logic circuit 132 requires a reference clock signal Ckref. The delay calibration logic circuit 132 and the digital controlled delay line 120 (including both the variable delay line 122 and fixed delay line 124) together form a closed loop shown as the dotted path, and the closed loop generates a periodic clock signal ckcalring, which is the output of the closed ring. The arrow on the dotted path also shows the signal flow direction in the closed loop. The internal calibration state machine within the closed loop starts the calibration process upon receiving a trigger signal, and outputs the result to the variable delay line 122. Note the dotted line with arrows indicating a clockwise circulation only closes during the calibration mode. During normal operating mode, the fixed delay line is switched out of the signal path does not work.

According to FIG. 4, when a digital signal passes the digital controlled delay line 120 (including both variable delay line 122 and the fixed delay line 124), the signal is delayed by $$T=Ta+(T0+dt\times D)$$

Where Ta represents a fixed delay time implemented by the fixed delay line 124 during calibration, which can significantly reduce calibration frequency. T0 represents the time delay when the control signal is zero. dt represents controllable delay resolution D represents a variable digital control word.

The purpose of calibration is to achieve $$dt\times D=Ncal\times Tvco$$

Wherein, Tvco represents the VCO period, Ncal represents the maximum controllable amount of delay in unit of Tvco. When Ncal is an integer power of two, the embodiment may achieve a simplified control. For example, if D corresponds to $2^n*Tvco$, then $1*Tvco$ corresponds to control D1=(D>>n). Logical right shift (>>) is easy to be implemented in a digital domain. However, if it is not $2^n$, then the digital implementation involves division, which is complicated to realize.

There are two non-synchronized clock inputs into the digital controlled delay line 120: (1) output signal of the closed ring formed by the delay line with fixed delay and variable delay, ckcalring, which has a period 2×T, where T=Ta+(T0+dt× D); (2) the low-frequency reference clock, Ckref. Fixed delay line will increase the total delay and reduce the operation frequency in calibration.

Further, the digital controlled delay line 120 further comprises a variable delay line 122 and a fixed delay line 124. The fixed delay line 124 is configured to be enabled in the calibration mode and be disabled in normal operation mode. The fixed delay line 124 is activated only for calibrating signal pathway. The fixed delay line 124 adds a fixed delay which is independent to the controllable delay generated by the variable delay line 122, in order to reduce the operating frequency in the calibration mode, whereas the fixed delay line does not add any noise in normal operation mode. The fixed delay line 124 and the variable delay line 122 together form a closed loop in the calibration mode.

Figure 5:
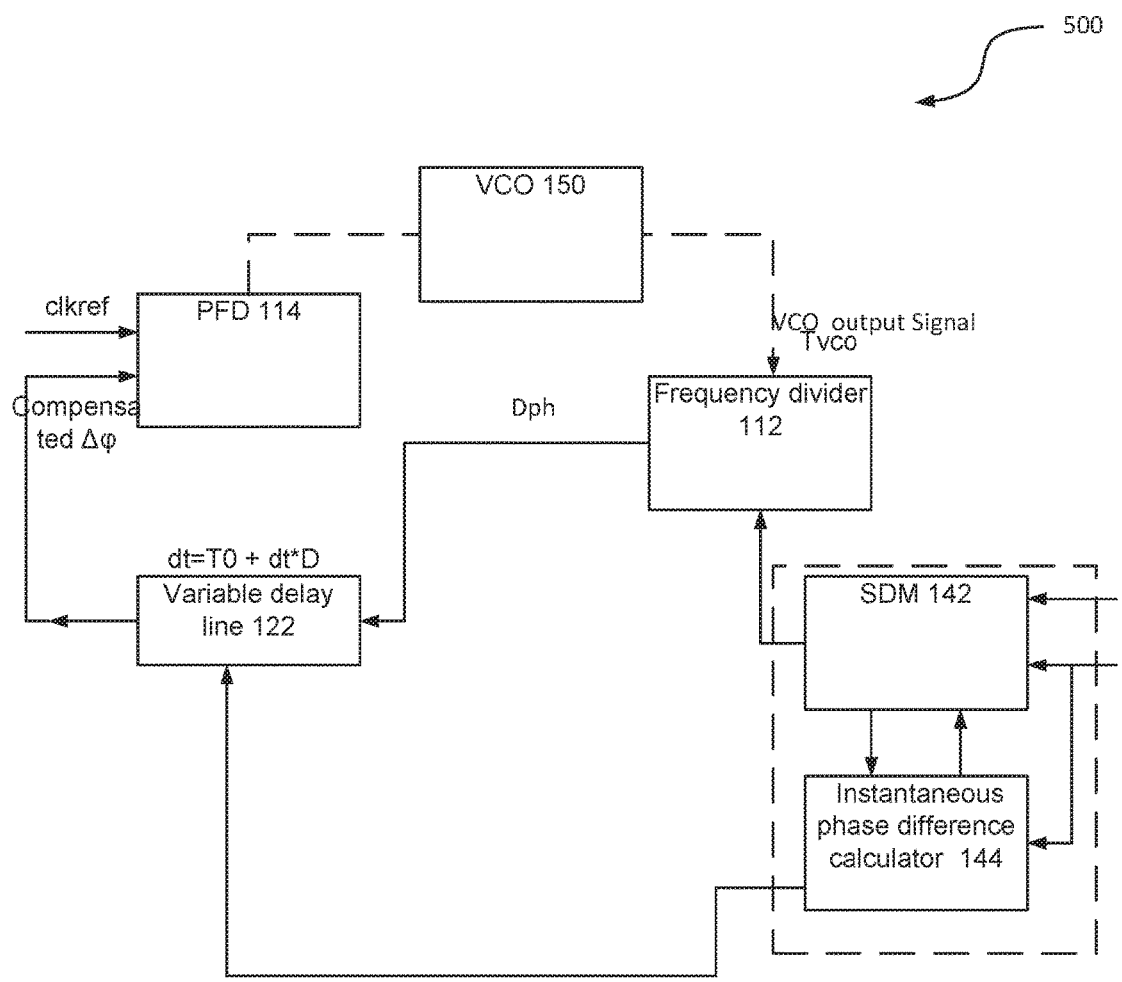
FIG. 5 is a diagram illustrating a flow chart of a method for operation principle of the circuit according to an embodiment of the invention.

FIG. 5 is a block diagram for a circuit 500 according to an embodiment of the invention. Compared with the circuit 300 shown in FIG. 3, the circuit 500 in FIG. 5 does not include the calibration controller 134 or the delay calibration logic circuit 132. The circuit 500 further does not include the fixed delay line 1220. Note FIG. 5 represents the circuit during normal operation when the calibration circuit 130 is disabled and the fixed delay line 124 is by-passed as compared to the calibration mode shown in FIG. 3.

Figure 6:
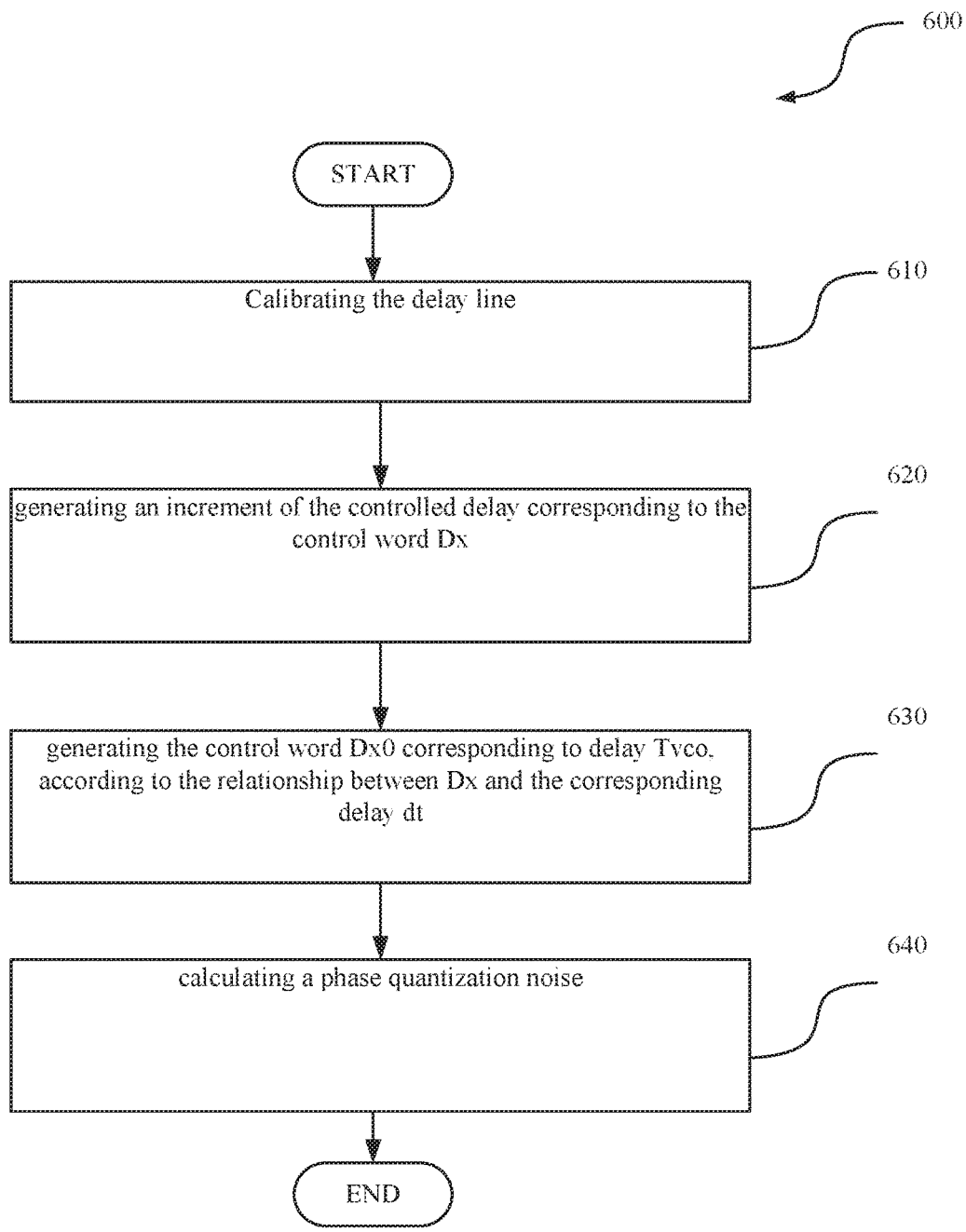
FIG. 6 is a diagram illustrating a flow chart of a method 600 for operation principle of the circuit according to an embodiment of the invention.

FIG. 6 is a diagram illustrating a flow chart of a method 600 for operation principle of the circuit according to an embodiment of the invention.

In block 610, the method 600 comprises calibrating the delay line. First, setting control word D=0, the delay line is calibrated.

After receiving the same trigger signals, two separate counters are used for counting each clock signal of ckcalring and Ckref, the content of the counters are identified as CNTckring and CNTckref respectively. The CNTckring threshold is set as Nring0=32×N div, note 32 can be replaced with $2^n$, wherein n≠5. The high N is chosen, the larger the size of the counter. Further 32 is chosen for simplicity, and it is not the only choice.

Where N div is the ratio between VCO's target frequency and the reference frequency, Ckref. In a frequency synthesizer applications, only the Ckref is provided by an external source, and it is considered as approximate ideal clock. In general, calibration and comparison of reference use ckref. When CNTckring reached this threshold Nring0, the value of CNTref is saved as Nref0. In this case, the following relationship is established, Nref0×Tref=Nring0×(2×Tring0). Note the period of ring oscillator (comprising the overall delay line) is 2*delay time, and ckref is provided by external source, which provides the baseline time of Tref.

Wherein Tring0=Ta+T0. T0 represents the delay of the calibrated delay line when the control word D is 0. Ta is the fixed delay, which is added to the controllable delay lien to form the overall delay line.

In block 620, the method 600 comprises generating an increment of the controlled delay corresponding to the control word Dx.

Assume the threshold for the ckref counter is set to Nref0+INref, the threshold for the ckcalring counter maintains Nring0. Using binary search method, each bit of control word of digital controlled delay line 120 is tested, so that the two counters ckref counter and ckcalring counter reach their corresponding threshold at about the same time, with an error smaller than 1 period of the ckcalring. The threshold of the ckref counter and the threshold for the ckcalring counter are respectively set, and may be different. In this case, the following relationship is established with sufficient accuracy, (Nref0+INref)×Tref=Nring0×2×(Tring0+dt(Dx)).

With the results obtained in the first step, the following conclusions can be obtained:

INref×Tref=Nring0×2×dt(Dx),

Therefore, dt(Dx)=INref×Tref/Nring0/2   (1)

For convenience of calculation, taking INref=32×8, then dt(Dx)=32×8×N div×Tvco/(N div×32)/2=4 Tvco;

Therefore, when the control word is Dx, the increment of controlled delay is 4Tvco. Note the INref can take other values.

In block 630, the method 600 comprises generating the control word Dx0 corresponding to a delay of Tvco, according to the relationship between Dx and the corresponding delay dt, as shown above. The value of Dx0 represents a calibration result, and will be used in the SDM and Phase Difference calculator 140 as the gain coefficient to generate a control word for phase delay. The time delay obtained from the phase delay will be used to compensate for quantized phase noise. According to the above example, taking into account the linear character of delay time control, the increments of delay is Tvco with sufficient accuracy, when the control word Dx>>2.

The above embodiment illustrates the full scale scenario, which is shown in equation (1). Alternatively, another embodiment may be applicable to half-scale scenario, wherein as the delay time decreases, the threshold of the counters should be modified compared with the above full scale scenario. Further, in order to achieve the same precision, the lengths of the two counters need to be lengthened.

In block 640, the method 600 comprises calculating a phase quantization noise. Block 640 in FIG. 6 will be further discussed below with reference to FIG. 7.

Figure 7:
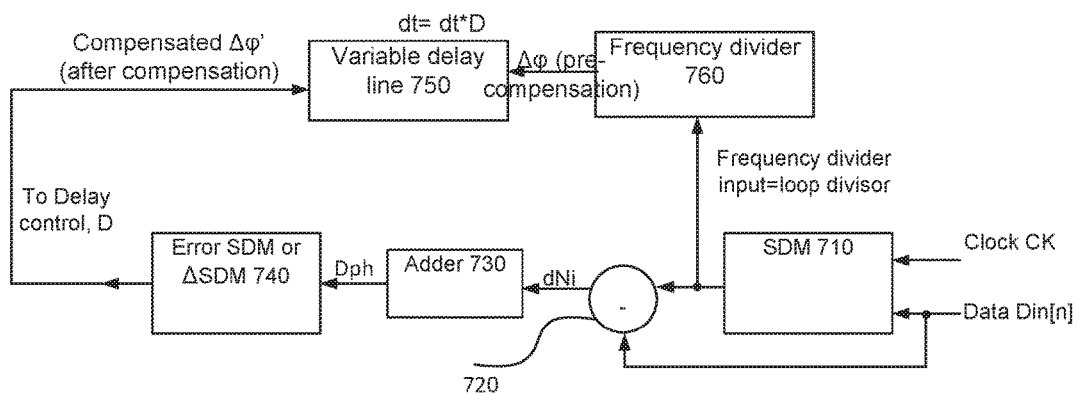
FIG. 7 is a block diagram for illustrating counting for quantized noise.

FIG. 7 is a block diagram illustrating the calculation of quantized noise.

In a fractional frequency synthesizer 700, the average of loop frequency divider ratio over a long time has the given decimal value of Din. However, in every division cycle, the SDM output which controls division ratio for the next reference cycle to the frequency divider 760 is an integer. As such, in each cycle, quantized phase noise will be introduced. Due to the certainty of the input and output to the SDM in each cycle, the phase quantized noise Dph equals the accumulation of all its prior frequency division errors dNi, Dph is a digital representation of limited bit width, that is, Dph=Σ[dNi]

Wherein dNi represents the difference between the input for a time division number (decimal) Data Din[n] and the output loop divider ratio (integer), which is in the unit of Tvco. dNi can be calculated by using subtraction in 720. The details of Ni, on the other hand, can be referred to the description discussed with respect to FIG. 2. Further, the addition of all prior frequency division errors dNi can be performed by an adder 730.

Taking into account that the bit width of Dph, for example 20 bits, is much larger than the bits width of delay control, for example 8 bits or less, the error Sigma-Delta-Modulator 740 (or Δ SDM) can be used for converting large bit width to small bit width, as shown in FIG. 7, as it may be impractical to use the 20-bit. In other words, the error Sigma-Delta-Modulator re-quantizes the instantaneous error of the loop SDM, or the difference between the loop SDM output and its input. However, the effect of the second quantization noise introduced is negligible to the overall phase noise.

With the delay calibration results, delay control signal for compensating for the quantization noise is:

D=Dx0×Dph;

Then the delay control signal D is fed to the variable delay line 750 for compensating quantized noise.

Figure 8:
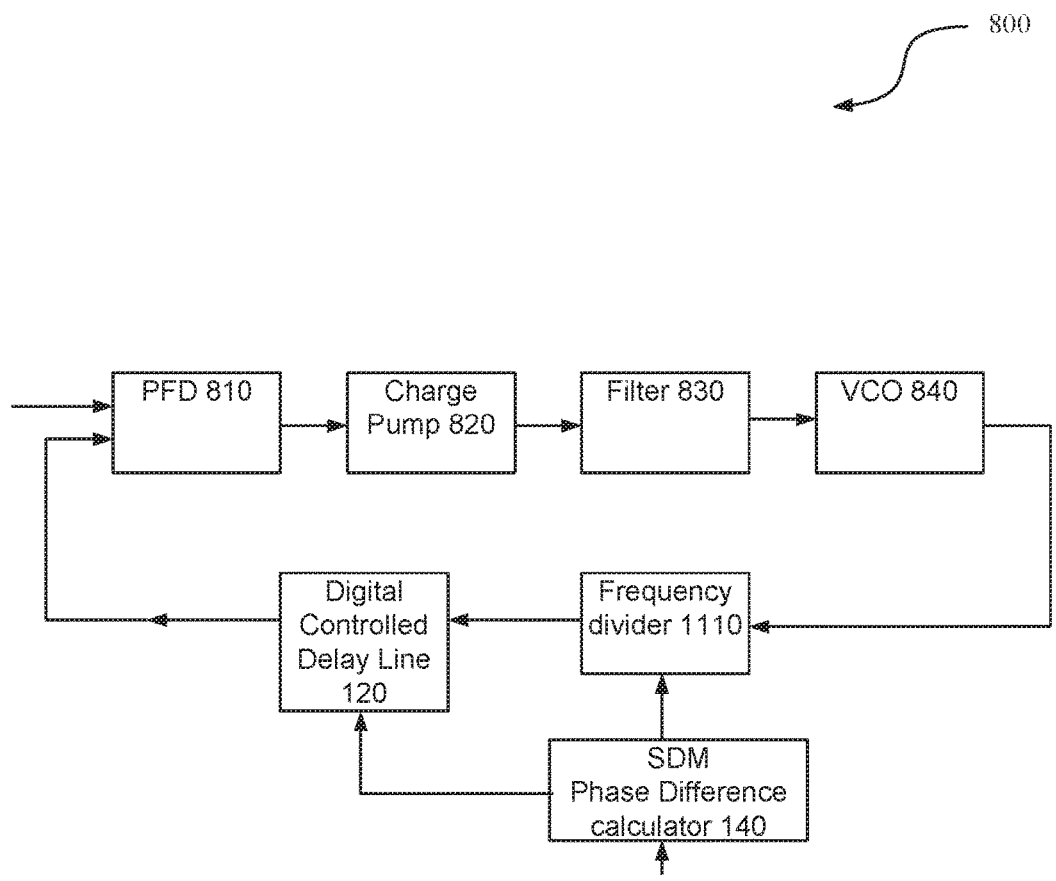
FIG. 8 is a frequency synthesizer including the circuit for compensating quantized noise according to an embodiment of the invention.

FIG. 8 is a frequency synthesizer 800 including the circuit for compensating quantized noise according to an embodiment of the invention.

In addition to the frequency divider 112, the digital controlled delay line 120 and the SDM Phase difference calculator 140 discussed at least with respect to FIG. 1, the frequency synthesizer 800 further comprises a phase frequency detector (PFD) 810 configured to receive the compensated signal A co (or the signal after compensation) and a reference clock, and to output control signals according to phase and frequency difference between the phase compensated signal and the reference clock. The frequency synthesizer 800 further comprises a charge pump 820 coupled to the phase frequency detector 810, configured to generate a current according to the PFD output signals. A low pass filter 830 is coupled to the charge pump, configured to generate a voltage according to the current. The filter 830 may be a low pass filter. Note other filters can also be used, for example, band pass filter (BPF), etc. A voltage controlled oscillator (VCO) 840 coupled to the filter 830, configured to generate an oscillation frequency according to the voltage. The frequency divider 112 is coupled to the VCO 840 and configured to receive the oscillation frequency, to divide the oscillation frequency, and to generate the output of the frequency divider.

One advantage of an embodiment of the present invention is to design a circuit for compensating quantization noise for fractional-N frequency synthesizer. The embodiment may realize calibration mechanism by digital controlled delay line with simple structure and low power consumption. Further the embodiment uses a small bit width for digital control delay, wherein scaling of the delay magnitude is realized by digital circuit in the quantization noise calculation.

Figure 9:
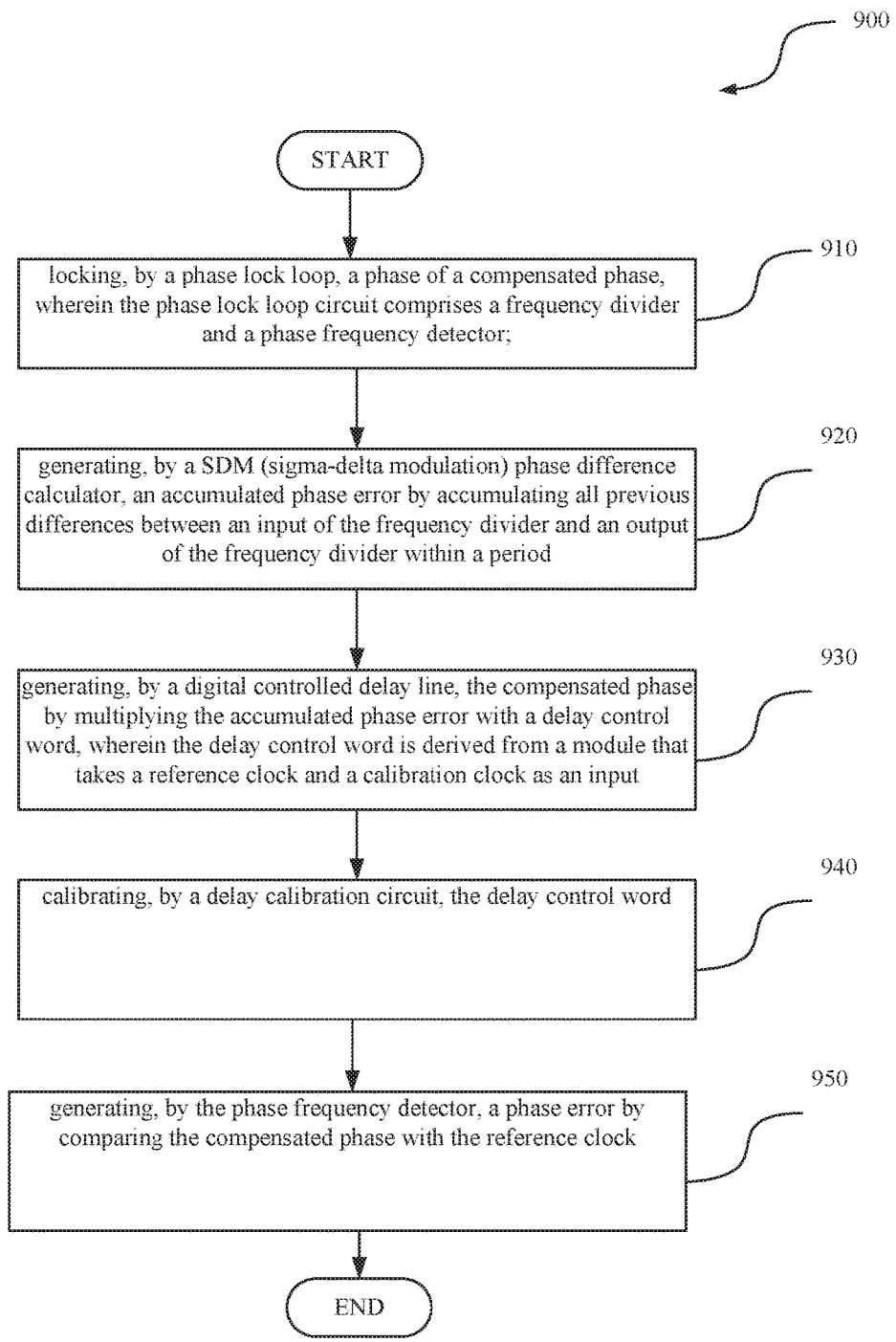
FIG. 9 is a flow chart illustrating a method of compensating quantized noise according to an embodiment of the invention.

FIG. 9 is a flow chart illustrating a method 900 of compensating quantized noise according to an embodiment of the invention.

The method 900 of compensating quantized noise in fractional-N frequency synthesizer, comprising locking, in block 910, by a phase lock loop, the phase compensated frequency divider output signal to a reference phase, wherein the phase lock loop circuit comprises a frequency divider and a phase frequency detector; generating, in block 920, by a SDM (sigma-delta modulation) and phase difference calculator, an accumulated phase error by accumulating all previous differences between an input of the frequency divider and an output of the frequency divider within a period; generating, in block 930, by a digital controlled delay line, the phase compensated signal by multiplying the accumulated phase error with a delay control word, wherein the delay control word is derived from a module that takes a reference clock and a calibration clock as an input; calibrating, in block 940, by a delay calibration circuit, the delay control word; and generating, in block 950, by the phase frequency detector, a phase error by comparing the compensated phase with the reference clock. For the block 940 for calibrating may be determined by controller according to Tref and calibration precision. Further, the calibration precision is a variable set based on system requirement.

Alternatively, the method 900 further comprises (not shown in FIG. 9) determining, by a calibration controller, whether the device works in calibration mode or in operation mode; and generating, by a delay calibration logic circuit, the delay control word if the calibration controller determines that the device works in calibration mode.

Alternatively, the method 900 further comprises generating (not shown in FIG. 9), by an instantaneous phase difference calculator, an instantaneous phase difference by subtracting the current input of the frequency divider from the current output of the frequency divider; and generating, by a sigma-delta modulator, the accumulated phase error by accumulating all previous instantaneous phase differences between the input of the frequency divider and the output of the frequency divider within the period.

Alternatively, the digital controlled delay line further comprises a variable delay line and a fixed delay line, the method 900 further comprises enabling the fixed delay line in a calibration mode and disable the fixed delay line in an operation mode, and forming, by the fixed delay line and the variable delay line, a closed loop in the calibration mode.

Alternatively, the variable delay line has a fixed bit width.

Alternatively, the method 900 further comprises receiving, by the phase frequency detector, the phase compensated signal and a reference clock, and to output charge pump control signals according to phase and frequency difference between the compensated phase and the reference clock; generating, by a charge pump, a current according to the control signals; generating, by a filter, a voltage according to the current; generating, by a voltage controlled oscillator (VCO), an oscillation frequency according to the voltage; and receiving the oscillation frequency, dividing the oscillation frequency, and generating the output by the frequency divider.

Although the present invention has been described with reference to specific exemplary embodiments, the present invention is not limited to the embodiments described herein, and it can be implemented in form of modifications or alterations without deviating from the spirit and scope of the appended claims. Accordingly, the description and the drawings are to be regarded in an illustrative rather than a restrictive sense.

From the foregoing, it will be appreciated that specific embodiments of the technology have been described herein for purposes of an illustration; however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. A circuit for compensating quantized noise in fractional-N frequency synthesizer, comprising
 a Phase Lock Loop (PLL) circuit, configured to lock a phase compensated signal to a phase of a reference phase, wherein the phase lock loop circuit comprises a frequency divider and a phase frequency detector;
 a SDM (sigma-delta modulation) and phase difference calculator coupled to the frequency divider and configured to generate an accumulated phase error by accumulating all previous differences between an input of the frequency divider and an output of the frequency divider within a period;

a digital controlled delay line coupled to both the frequency divider and the SDM and Phase Difference calculator and configured to generate the phase compensated signal by multiplying the accumulated phase error with a delay control word, wherein the delay control word is derived from a module that takes a reference clock and a calibration clock as an input; and the phase frequency detector is further configured to generate a phase error by comparing the phase compensated signal with the reference clock.

2. The circuit of claim 1, further comprising a delay calibration circuit coupled to both the digital controlled delay line and the SDM and phase difference calculator and is configured to calibrate the delay control word.

3. The circuit of claim 2, wherein the delay calibration circuit further comprises a delay calibration logic circuit and a calibration controller, wherein the calibration controller is configured to determine whether a device works in calibration mode or in operation mode; and the delay calibration logic circuit is coupled to the calibration controller and is configured to generate the delay control word if the calibration controller determines that the device works in calibration mode.

4. The circuit of claim 1, wherein the SDM and phase difference calculator further comprises a sigma-delta modulator and an instantaneous phase difference calculator;
wherein the instantaneous phase difference calculator is configured to generate an instantaneous phase difference by subtracting an instantaneous input of the frequency divider from an instantaneous output of the frequency divider; and
the sigma-delta modulator is coupled to the instantaneous phase difference calculator and is configured to generate the accumulated phase error by accumulating all previous instantaneous phase differences between the input of the frequency divider and the output of the frequency divider within the period.

5. The circuit of claim 1, wherein the digital controlled delay line further comprises a variable delay line and a fixed delay line,
wherein the fixed delay line is configured to be enabled in a calibration mode and be disabled in an operation mode, and
the fixed delay line and the variable delay line form a closed loop in the calibration mode.

6. The circuit of claim 5, wherein the variable delay line has a fixed bitwidth.

7. The circuit of claim 1, wherein
the phase frequency detector is configured to receive the phase compensated signal and the reference clock, and to output controls signals according to phase and frequency difference between the phase compensated signal and the reference clock; wherein
the PLL circuit further comprises—
a charge pump coupled to the phase frequency detector, configured to generate a current according to the control signals;
a filter coupled to the charge pump, configured to generate a voltage according to the current;
a voltage controlled oscillator (VCO) coupled to the filter, configured to generate an oscillation frequency according to the voltage; and
wherein the frequency divider coupled to the VCO and configured to receive the oscillation frequency, to divide the oscillation frequency, and to generate the output of the frequency divider.

8. A method of compensating quantized noise in fractional-N frequency synthesizer, comprising
locking, by a phase lock loop, a noise compensated signal to a reference phase, wherein the phase lock loop circuit comprises a frequency divider and a phase frequency detector;
generating, by a SDM (sigma-delta modulation) and phase difference calculator, an accumulated phase error by accumulating all previous differences between an input of the frequency divider and an output of the frequency divider within a period;
generating, by a digital controlled delay line, a phase compensated signal by multiplying the accumulated phase error with a delay control word, wherein the delay control word is derived from a module that takes a reference clock and a calibration clock as an input;
calibrating, by a delay calibration circuit, the delay control word; and
generating, by the phase frequency detector, a phase error by comparing a compensated phase with the reference clock.

9. The method of claim 8, further comprising
determining, by a calibration controller, whether a device works in calibration mode or in operation mode; and
generating, by a delay calibration logic circuit, the delay control word if the calibration controller determines that the device works in calibration mode.

10. The method of claim 8, further comprising:
generating, by an instantaneous phase difference calculator, an instantaneous phase difference by subtracting an instantaneous input of the frequency divider from an instantaneous output of the frequency divider; and
generating, by a sigma-delta modulator, the accumulated phase error by accumulating all previous instantaneous phase differences between an input of the frequency divider and an output of the frequency divider within the period.

11. The method of claim 8, wherein the digital controlled delay line further comprises a variable delay line and a fixed delay line, the method further comprises
enabling the fixed delay line in a calibration mode and disabling the fixed delay line in an operation mode, and
forming, by the fixed delay line and the variable delay line, a closed loop in the calibration mode.

12. The method of claim 11, wherein the variable delay line has a fixed bitwidth.

13. The method of claim 8, further comprising
receiving, by the phase frequency detector, the compensated phase and the reference clock, and to output control signals according to phase and frequency difference between the compensated phase and the reference clock;
generating, by a charge pump, a current according to the control signals;
generating, by a filter, a voltage according to the current;
generating, by a voltage controlled oscillator (VCO), an oscillation frequency according to the voltage; and
receiving the oscillation frequency, dividing the oscillation frequency, and generating the output by the frequency divider.

* * * * *